US008343825B2

United States Patent
Domenicucci et al.

(10) Patent No.: US 8,343,825 B2
(45) Date of Patent: Jan. 1, 2013

(54) REDUCING DISLOCATION FORMATION IN SEMICONDUCTOR DEVICES THROUGH TARGETED CARBON IMPLANTATION

(75) Inventors: Anthony G. Domenicucci, New Paltz, NY (US); Shreesh Narasimha, Beacon, NY (US); Karen A. Nummy, Newburgh, NY (US); Viorel C. Ontalus, Danbury, CT (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 13/009,020

(22) Filed: Jan. 19, 2011

(65) Prior Publication Data

US 2012/0184075 A1    Jul. 19, 2012

(51) Int. Cl.
*H01L 21/336* (2006.01)
(52) U.S. Cl. .................. 438/197; 257/E21.409
(58) Field of Classification Search ............. 438/166, 438/197, 293, 486; 257/E21.154, E21.409, 257/E21.412, E21.703
See application file for complete search history.

(56) References Cited

U.S. PATENT DOCUMENTS

| | | | |
|---|---|---|---|
| 3,834,897 A | 9/1974 | Nevalainen et al. |
| 4,697,202 A | 9/1987 | Sher |
| 5,323,031 A | 6/1994 | Shoji et al. |
| 5,540,904 A | 7/1996 | Bovenkerk et al. |
| 5,906,708 A | 5/1999 | Robinson et al. |
| 6,064,081 A | 5/2000 | Robinson et al. |
| 6,258,695 B1 | 7/2001 | Dunn et al. |
| 6,426,265 B1 | 7/2002 | Chu et al. |
| 6,670,654 B2 | 12/2003 | Lanzerotti et al. |
| 6,815,802 B2 | 11/2004 | Chu et al. |
| 7,193,254 B2 | 3/2007 | Chan et al. |
| 7,381,623 B1 | 6/2008 | Chen et al. |
| 7,396,717 B2 | 7/2008 | Wang et al. |
| 7,402,872 B2 | 7/2008 | Murthy et al. |
| 7,442,611 B2 | 10/2008 | Chan et al. |

(Continued)

FOREIGN PATENT DOCUMENTS

JP    62210618 A    9/1987

OTHER PUBLICATIONS

S.-M. Koh et al., "N-Channel MOSFETs With Embedded Silicon-Carbon Source/Drain Stressors Formed Using Cluster-Carbon Implant and Excimer-Laser-Induced Solid Phase Epitaxy," IEEE Electron Device Letters, vol. 29, No. 12, 2008, pp. 1315-1318, Dec. 2008.

(Continued)

*Primary Examiner* — Julio J Maldonado
*Assistant Examiner* — Daniel Shook
(74) *Attorney, Agent, or Firm* — Cantor Colburn LLP; Ian MacKinnon

(57) ABSTRACT

A method of forming a semiconductor device includes implanting an amorphizing species into a crystalline semiconductor substrate, the substrate having a transistor gate structure formed thereupon. Carbon is implanted into amorphized regions of the substrate, with specific implant conditions tailored such that the peak concentration of carbon species coincides with the end of the stacking faults, where the stacking faults are created during the recrystallization anneal. The implanted carbon pins partial dislocations so as to prevent the dislocations from disassociating from the end of the stacking faults and moving to a region in the substrate directly below the transistor gate structure. This removes the defects, which cause device leakage fail.

21 Claims, 8 Drawing Sheets

U.S. PATENT DOCUMENTS

| | | |
|---|---|---|
| 7,582,547 B2 | 9/2009 | Pawlak |
| 7,666,771 B2 | 2/2010 | Krull et al. |
| 7,678,637 B2 | 3/2010 | Nandakumar et al. |
| 7,700,450 B2 | 4/2010 | Lee et al. |
| 7,714,358 B2 | 5/2010 | Liu et al. |
| 2008/0191243 A1* | 8/2008 | Liu et al. .................. 257/190 |
| 2009/0001371 A1 | 1/2009 | Mowry et al. |

OTHER PUBLICATIONS

B. Yang et al., "High-performance nMOSFET With In-Situ Phosphorus-doped Embedded Si:C (ISPD eSi:C) Source-drain Stressor," IEDM Tech Dig, 2008. pp. 51-54.

N. G. Rudawski et al., "Amorphization and Solid-Phase Epitaxial Growth of C-Cluster," Journal of Electronic Materials, vol. 38, No. 9, 2009, pp. 1926-1930, Jun. 2009.

Wei et al., "Multiple Stress Memorization in Advanced SOI CMOS Technologies," Symposium on VLSI Technology Digest of Technical Papers, pp. 216-217, 2007.

Domenicucci et al.; U.S. Appl. No. 12/511,535, filed Jul. 29, 2009.

J. W. Strane et al., "Carbon Incorporation Into Si at High Concentrations by Ion Implantation and Solid Phase Epitaxy," J. Appl. Phys., vol. 79, 1996, pp. 637-646, Jan. 1996.

* cited by examiner

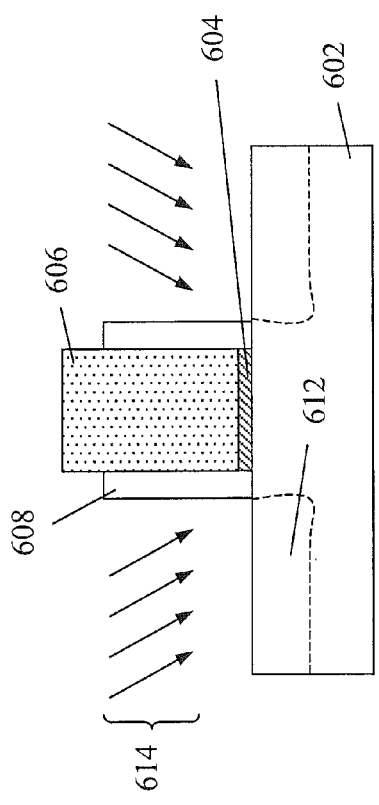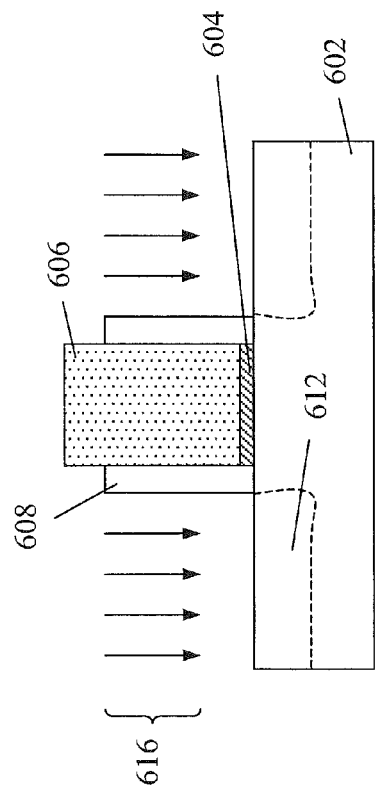
Figure 8
Figure 9

REDUCING DISLOCATION FORMATION IN SEMICONDUCTOR DEVICES THROUGH TARGETED CARBON IMPLANTATION

BACKGROUND

The present invention relates generally to semiconductor device manufacturing and, more particularly, to methods of reducing dislocation formation in semiconductor devices through targeted carbon implantation.

Mechanical strains within a semiconductor device substrate can modulate device performance by, for example, increasing the mobility of the carriers in the semiconductor device. That is, strains within a semiconductor device are known to enhance semiconductor device characteristics. Thus, to improve the characteristics of a semiconductor device, tensile and/or compressive strains are created in the channel of n-type field effect transistors (NFETs) and/or p-type field effect transistors (PFETs), respectively.

However, the same strain component, for example, tensile strain or compressive strain in a certain direction, may improve the device characteristics of one type of device (i.e., n-type device or p-type device) while discriminatively affecting the characteristics of the other type device. Accordingly, in order to maximize the performance of both NFETs and PFETs within integrated circuit (IC) devices, the strain components should be engineered and applied differently for NFETs and PFETs.

Distinctive processes and different combinations of materials are used to selectively create a strain in a FET. For example, stress memorization techniques (SMT) have been developed to enhance device performance. In SMT, a stress liner encapsulates an NFET device, which is then subjected to a high temperature anneal. The high temperature anneal can be upwards of about 1100° C. The combination of the amorphizing extension ion implant, a high temperature anneal and stress liner creates stacking fault type defects in the silicon (Si) of the NFET device, near the gate. After anneal, the stress nitride liner is removed by the chemical etch. However, in so doing, the effect of the stress still remains within the NFET device. This effect is known as a stress memorization technique (SMT).

On the other hand, because the stacking fault can act as a dislocation nucleation site under the influence of high stress and high temperature process conditions, dislocations are prone to appear, mainly on high mobility NFETs. The dislocation defects have been found to coincide with the placement of the stress film on the high stress side of the device after a high temperature anneal. This dislocation starts at the end of one stacking fault and, under the influence of high temperature (of about 1100° C.) and stress, moves on a [100] plane towards the gate electrode. It has been found that the dislocations end either at the surface of the Si (side wall of Si) or at another stacking fault.

Stacking faults have either an extra plane or a missing plane in the [111] stacking direction. The depth and density of stacking faults may vary depending with the process condition. Normally, the more stress during the re-crystallization process, the higher the density of stacking faults generated along the gate. Stacking faults may end in a partial dislocation in single crystal Si or at a Si surface. Although the partial dislocations are relative immobile, as mentioned above, the end of a fault may act as a source of dislocations under certain process conditions such as high temperature and high stress.

Dislocation defects in an otherwise perfect, monolithic crystal structure introduce unwanted and abrupt changes in electrical and optical properties. For example, a dislocation that crosses a junction can cause junction leakage. Dislocation defects are illustrated in the devices shown in FIGS. 1 and 2. In particular, FIG. 1 is a transmission electron microscope (TEM) photograph illustrating a top view of an NFET device where a dislocation defect is formed in the substrate directly beneath the gate. FIG. 2 is a TEM photograph illustrating a cross sectional view of an NFET device where a dislocation defect (indicated by the arrow) is formed in the substrate directly beneath the gate. Such dislocation defects can impair device performance, for example, by causing high device leakage. In fact, it has been found that device leakage may be in the range of about 10-40 microamps ($\mu$A) for an NFET device.

SUMMARY

In one aspect, a method of forming a semiconductor device includes implanting an amorphizing species into a crystalline semiconductor substrate, the substrate having a transistor gate structure formed thereupon; implanting carbon into amorphized regions of the substrate; and performing a recrystallization anneal so as to generate stacking faults within the substrate, wherein the implanted carbon pins partial dislocations so as to prevent the dislocations from disassociating from the stacking faults and moving to a region in the substrate directly below the transistor gate structure.

In another aspect, a method of forming a transistor device includes forming a gate structure over a crystalline semiconductor substrate; forming a first set of sidewall spacers adjacent the gate structure; implanting an amorphizing species into the crystalline semiconductor substrate; implanting carbon into amorphized regions of the substrate; forming a second set of sidewall spacers adjacent the first set of sidewall spacers and implanting source and drain regions; forming a stress-inducing layer over the substrate and gate structure; and performing a recrystallization anneal so as to generate stacking faults within the substrate, wherein the implanted carbon pins partial dislocations so as to prevent the dislocations from disassociating from the stacking faults and moving to a region in the substrate directly below the transistor gate structure, and wherein the recrystallization anneal is performed at a temperature sufficient to activate dopant material of the source and drain regions.

In another aspect, a method of forming a transistor device includes forming a gate structure over a crystalline semiconductor substrate; forming a first set of sidewall spacers adjacent the gate structure; implanting an amorphizing species into the crystalline semiconductor substrate; implanting carbon into amorphized regions of the substrate; forming a second set of sidewall spacers adjacent the first set of sidewall spacers and implanting source and drain regions; forming a stress-inducing layer over the substrate and gate structure; performing a recrystallization anneal so as to generate stacking faults within the substrate, wherein the implanted carbon pins partial dislocations so as to prevent the dislocations from disassociating from the stacking faults and moving to a region in the substrate directly below the transistor gate structure, and wherein the recrystallization anneal is performed at a temperature sufficient to generate the stacking faults and without activating dopant material of the source and drain regions; removing the stress-inducing layer; and performing an activation anneal so as to activate the dopant material of the source and drain regions.

BRIEF DESCRIPTION OF THE SEVERAL VIEWS OF THE DRAWINGS

Referring to the exemplary drawings wherein like elements are numbered alike in the several Figures:

FIGS. 6 through 12 are a sequence of cross sectional views illustrating a transistor device that may be formed in accordance with the embodiments of either FIG. 3 or FIG. 4, where in particular:

FIG. 6 illustrates a patterned gate stack structure over a substrate;

FIG. 7 illustrates implantation of an amorphization species in the substrate, corresponding to source and drain extension regions;

FIG. 8 illustrates targeted implantation of a carbon species to pin dislocations by preventing the dislocations from disassociating from stacking faults;

FIG. 9 illustrates another implantation of an amorphization species in the substrate to ensure the regions under source and drain are fully amorphized;

FIG. 10 illustrates the formation of deep source and drain regions;

FIG. 11 illustrates the formation of a high-stress nitride layer;

FIG. 12 illustrates the removal of the high-stress nitride layer following a recrystallization anneal.

DETAILED DESCRIPTION

As indicated above, existing SMT techniques typically result in NFET device performance enhancement of about 5% or more, in which an amorphization species such as germanium (Ge) or xenon (Xe) is used to amorphize the semiconductor substrate (e.g., Si). After Si amorphization, a high-stress silicon nitrided film is deposited onto the Si surface. An activation temperature between about 900-1080° C. is typically applied to both activate the dopant and at the same time cause recrystallization of Si. During that high temperature process, stacking faults are generated due to two different crystalline growth fronts: a vertical growth front and a horizontal growth front. When these two fronts meet, stacking faults are generated, which create stress points in the Si. However, located at the end of these stacking faults is a partial dislocation. If certain conditions are met, a partial dislocation can disassociate from a stacking fault move into the junction due to the stress condition provided by the SiN film. Thus, in order to prevent a partial dislocation from disassociating with the stacking fault and moving away from its original location, the present embodiments implant carbon interstitial atoms in order to pin the partial dislocations and prevent them from causing device failure.

Figure 2:
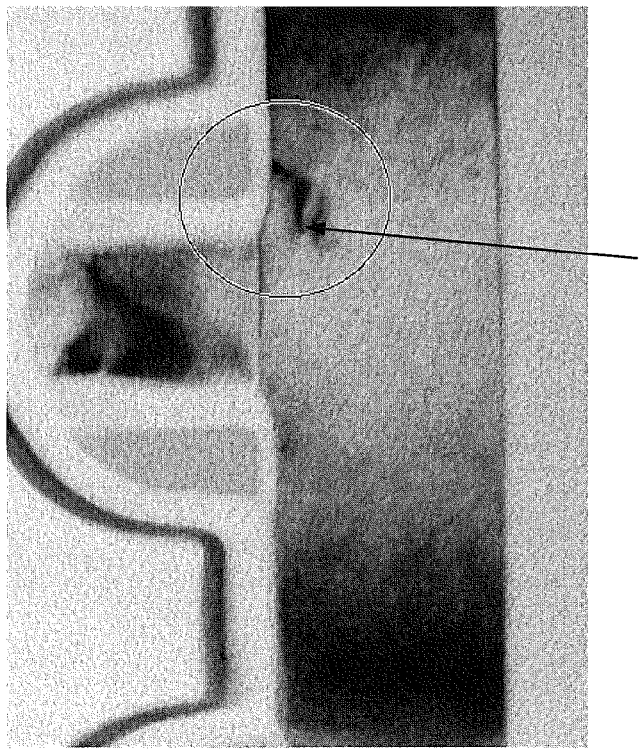
FIG. 2 is a TEM photograph illustrating a cross sectional view of an NFET device where a dislocation defect is formed in the substrate directly beneath the gate.
Figure 1:
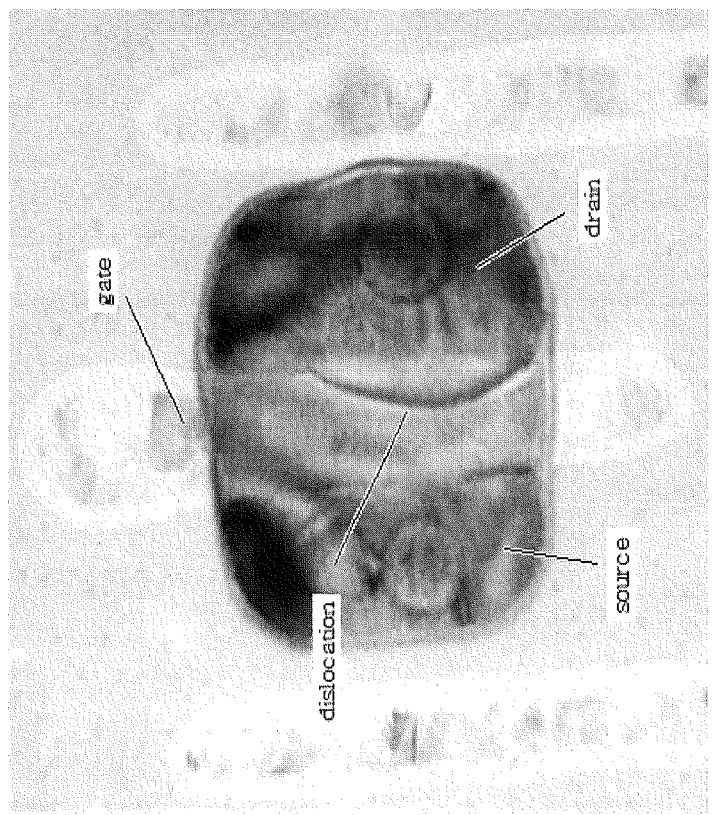
FIG. 1 is a TEM photograph illustrating a top view of an NFET device where a dislocation defect is formed in the substrate directly beneath the gate.
Figure 3:
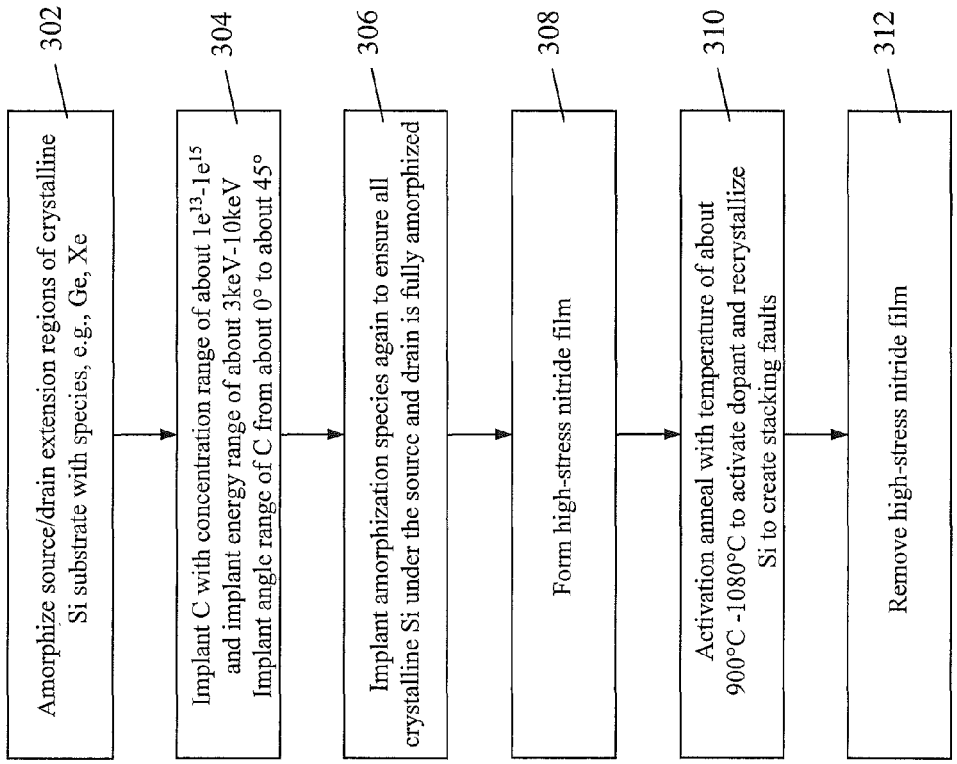
FIG. 3 is a flow diagram illustrating a method of reducing dislocation formation in semiconductor devices through targeted carbon implantation, in accordance with an exemplary embodiment of the invention.

Referring now to FIG. 3, there is shown a flow diagram illustrating a method 300 of reducing dislocation formation in semiconductor devices through targeted carbon implantation, in accordance with an exemplary embodiment of the invention. In this embodiment, an amorphization species such as Ge or Xe is implanted to amorphize the source and drain extension regions of crystalline Si, as reflected in block 302. Then, in block 304, carbon is implanted with a concentration range of about $1 \times 10^{13}$ atoms/cm$^3$ to about $1 \times 10^{15}$ atoms/cm$^3$, and an energy range of about 3 keV-10 keV. The angle of the implant may be in the range of about 0° to about 45°, where a higher implantation angle provides better control of dislocation movement.

Upon implantation of the carbon species, the amorphization species (e.g., Ge, Xe) is implanted again in order to ensure that all of the crystalline Si under the source and drain is fully amorphized, as shown in block 306. As shown in block 308, a stress film (e.g., nitride) is formed such as by deposition to create a stress condition prior to Si re-crystallization. An activation anneal at a temperature range of about 900° C. to about 1080° C. is applied to activate source/drain dopant and recrystallize the Si to create desired stacking faults, as shown in block 310. In this embodiment, since the high temperature anneal is used for both recrystallization and dopant activation, the nitride stress liner referred to above remains over the transistor devices. Then, as shown in block 312, the high-stress nitride layer is removed for further device processing. In so doing, the stress (tensile in the case of NFET) devices remains in the channel, while the carbon implantation prevents dislocations from disassociating from the stacking faults and moving into the device channel.

In addition to utilizing carbon implantation to pin dislocations, it has also been discovered that the strain applied to the channel (which, again, enhances device performance due to plastic deformation resulting in stacking faults at the gate edge) can be generated at lower recrystallization temperatures (i.e., at lower annealing temperatures) with the stress nitride film in place. Moreover, the low temperature recrystallization anneal may be performed without the formation of dislocations moving along the [100] plane, as is the case for a high annealing temperature with high stress nitride film.

Figure 4:
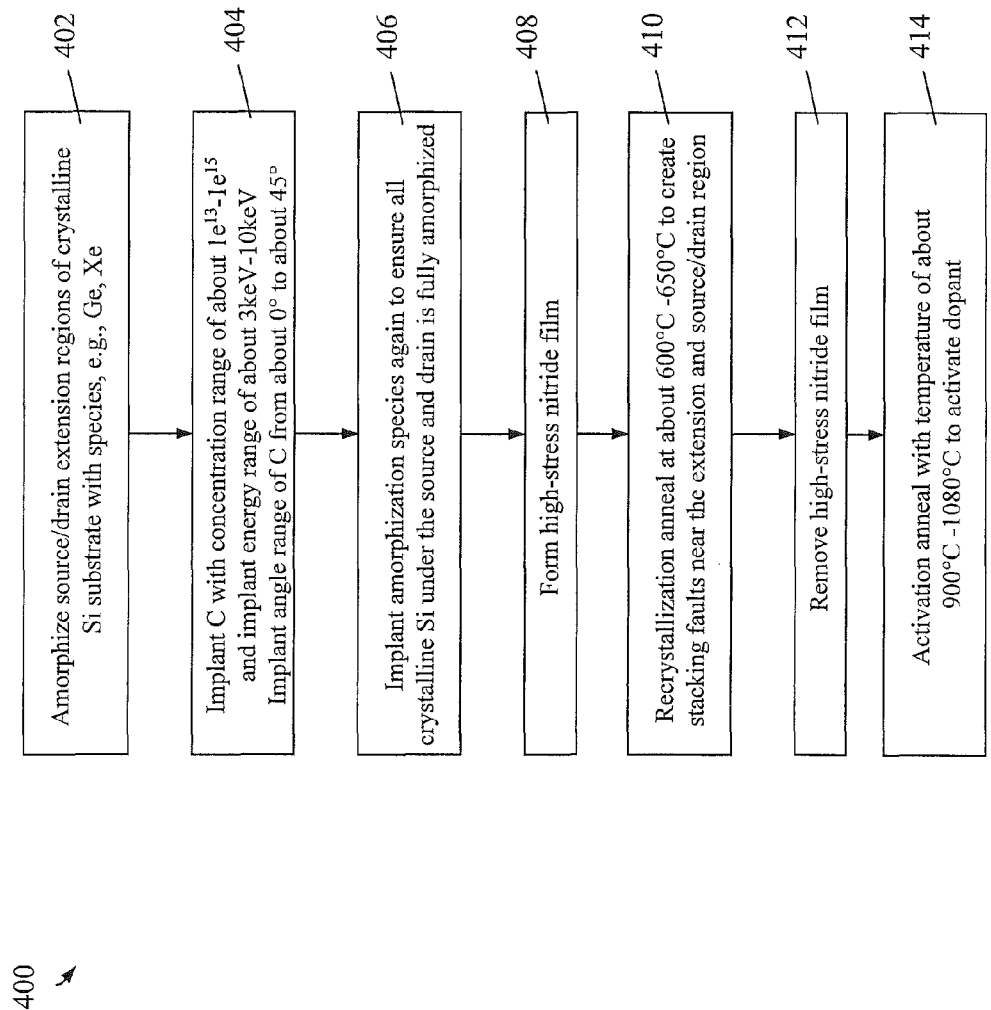
FIG. 4 is a flow diagram illustrating a method of reducing dislocation formation in semiconductor devices through targeted carbon implantation, in accordance with another exemplary embodiment of the invention.

Accordingly, FIG. 4 is a flow diagram illustrating a method 400 of reducing dislocation formation in semiconductor devices through targeted carbon implantation, in accordance with another exemplary embodiment of the invention. As is the case with the first embodiment, the method 400 includes implantation of an amorphization species such as Ge or Xe to amorphize the source and drain extension regions of crystalline Si, as reflected in block 402. Then, in block 404, carbon is implanted with a concentration range of about $1 \times 10^{13}$ atoms/cm$^3$ to about $1 \times 10^{15}$ atoms/cm$^3$, and an energy range of about 3 keV-10 keV. Again, the angle of the carbon implant may be in the range of about 0° to about 45°, where a higher implantation angle provides better control of dislocation movement. Upon implantation of the carbon species, the amorphization species (e.g., Ge, Xe) is implanted again in order to ensure that all of the crystalline Si under the source and drain is fully amorphized, as shown in block 406. As shown in block 408, a stress film (e.g., nitride) is formed such as by deposition to create a stress condition prior to Si re-crystallization.

In contrast to the first embodiment, the second embodiment implements a low temperature recrystallization anneal, as shown in block 410. Here, an anneal on the order of about 600° C. to about 650° C. is sufficient to create stacking faults near the extension and source/drain regions, but without activating the dopants. Following recrystallization, the high stress nitride film is removed as shown in block 412. Then, a second, high temperature anneal at a temperature range of about 900° C. to about 1080° C. is applied to activate the source/drain dopant, as shown in block 414.

In both embodiments, the carbon implant inserts interstitial atoms to pin the dislocation at a fixed point, which in turn prevents dislocations from disassociating from the edge of the stacking faults. In the case of the second embodiment, since the stacking faults are created at a recrystallization temperature much lower than the dopant activation temperature, a low temperature anneal, creates stacking faults, which in turn allows stress to be created in the channel. At the same time, the low temperature anneal substantially decreases the likelihood that dislocations will disassociate from the stacking faults. By combining both an angled carbon implant to pin the dislocation movement and low temperature annealing to prevent dislocation movement, the dislocation problem is controlled while still obtaining the benefit of stacking faults, which in turn increases the tensile stress in the channel region and enhances NFET device performance.

Further, for either embodiment of FIG. 3 or FIG. 4, it is desirable to ensure the maximum use of carbon species with a minimum amount of carbon implant, as too much carbon implant could cause device shift. In addition, the control voltage of the device is mostly influenced by the dopant species near the surface. Thus, by concentrating the carbon implant deeper into the Si at the depth of the stack faults, it makes device processing transparent through the carbon implant. At the same time, pin the partial dislocation is pinned at the end of the stacking faults, which prevents dislocation moving into the device region to cause leakage of the device.

Figure 5:
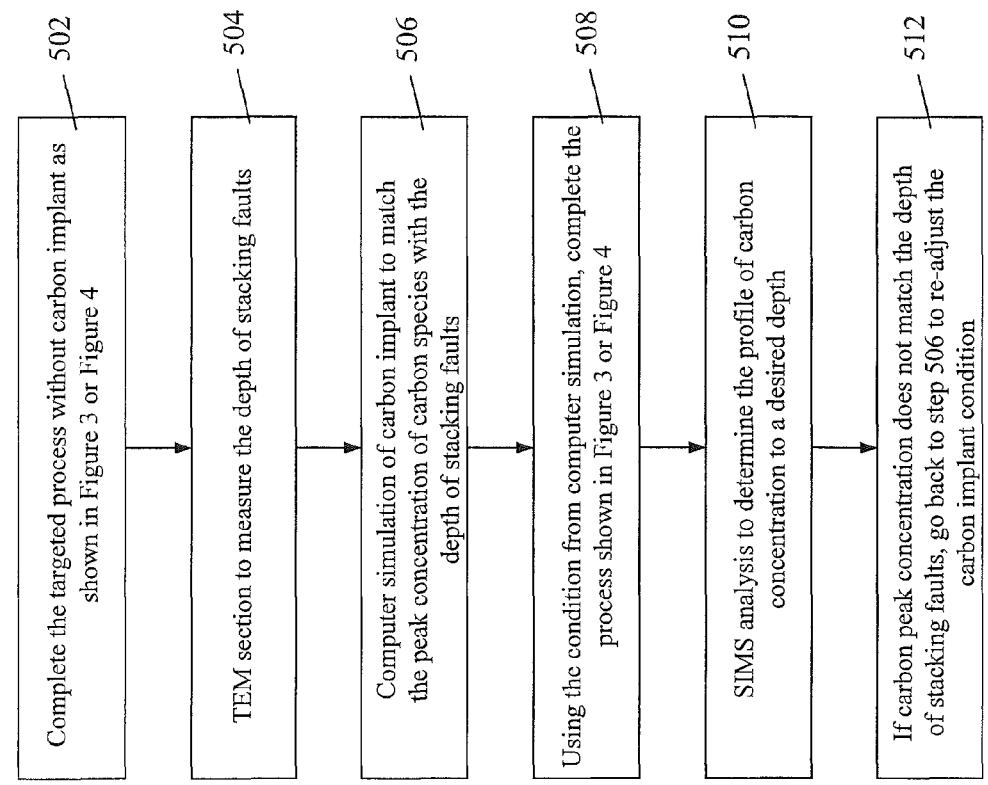
FIG. 5 is a flow diagram illustrating a method of maximizing a peak carbon implant concentration at the depth of the stacking faults for either the method of FIG. 3 or FIG. 4.

Referring now to FIG. 5, there is shown a flow diagram illustrating a method 500 of maximizing a peak carbon implant concentration at the depth of the stacking faults for either the method of FIG. 3 or FIG. 4. As shown in block 502, either the process of FIG. 3 or FIG. 4 is initially performed, with the exception of the carbon implant. With this sample, a TEM image is taken and the depth of the created stacking faults is measured, as shown in block 504. Given this depth information, a computer simulation of carbon implantation is then performed in an attempt to match the peak concentration of the carbon species with the depth of the stacking faults, as shown in block 506.

Based on the simulated implant conditions, the process of FIG. 3 or FIG. 4 is performed, this time including the carbon implantation, a show in block 508. Then, as shown in block 510, secondary ion mass spectrometry (SIMS) is performed on the completed sample to determine whether the actual peak concentration of the implanted carbon species coincides with the depth of stacking faults. If determined in block 512 that the peak concentration does not coincide, the process returns to block 506 to readjust the computer simulated conditions to match the peak concentration of carbon with the depth of stacking faults.

Figure 6:
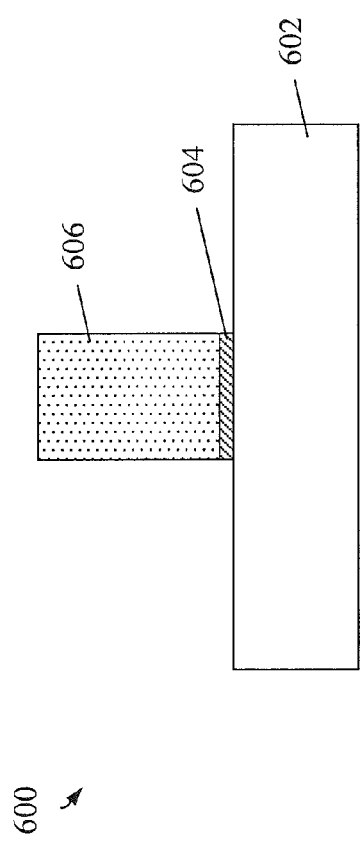

Referring generally now to FIGS. 6 through 12, there is shown a sequence of cross sectional views illustrating a transistor device that may be formed in accordance with the embodiments of either FIG. 3 or FIG. 4. More specifically, FIG. 6 shows a starting structure 600 including a substrate 602 having a gate stack structure patterned thereon, including a gate dielectric layer 604 (e.g., oxide) and a gate electrode 606 (e.g., polysilicon, metal, etc). In exemplary embodiments, the substrate 602 may include silicon, non-crystalline bulk materials, silicon-on-insulator (SOI), to name a few material types.

The gate structure may be formed using conventional photolithographic processes, as is well known to those skilled in the art. By way of a non-limiting illustration, the gate stack structure may be formed by depositing a gate dielectric layer 604 and a polysilicon layer 606 on the substrate 602 using conventional deposition processes such as, for example, chemical vapor deposition (CVD), physical vapor deposition (PVD), atomic layer deposition (ALD), etc. A resist (not shown) is deposited on the polysilicon layer 606, with selective portions of the resist being exposed to form openings. In subsequent processes, the exposed polysilicon layer 606, and subsequently the exposed gate dielectric layer 604 are etched away using a conventional process such as, for example, reactive ion etching (RIE). The remaining resist can be stripped away using wet or dry methods, such as downstream oxygen plasma processes.

Figure 7:
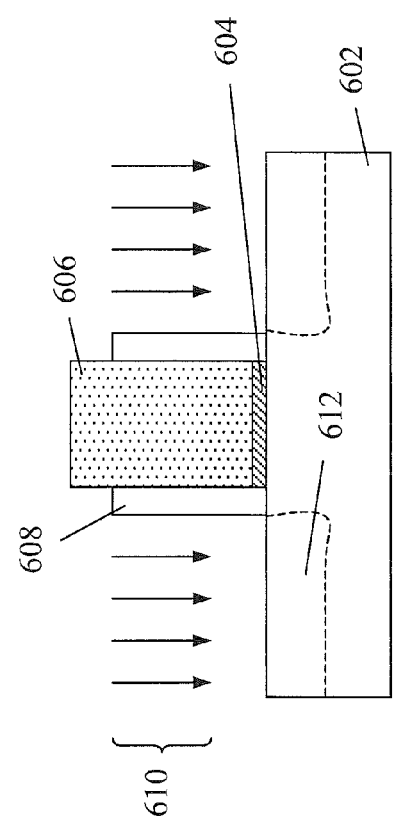

As shown in FIG. 7, a first set of spacers 608 is formed on sidewalls of the patterned gate electrode 606 and gate dielectric layer 604. The spacers 608 are formed using conventional deposition of, for example, $SiO_x$, and etching to a thickness of about 5 nanometers (nm) to about 10 nm. Other dimensions, however, are also contemplated. As also shown in FIG. 7, an extension implant process (as represented by the arrows 610) is used to define source and drain extension regions 612. The extension regions are formed by implantation of suitable dopant species at known energy and dose levels. In the case of an NFET device, n-type dopants such as arsenic (As) or phosphorus (P) may be used. In addition, a first amorphizing species implant as discussed above (e.g., Xe, Ge) is also performed so as to amorphize the source and drain extension regions 612 adjacent the gate stack structure. As will be appreciated, the use of the spacers 608 results in the amorphized source and drain extension regions 612 being spaced slightly away from the gate structure. Further, it is contemplated that the extension and first amorphizing implantations may be done separately or together, using the first set of spacers 608.

Proceeding now to FIG. 8, a carbon implant is then performed, as indicated by the inclined arrows 614. As described in conjunction with the embodiments above, the carbon may be implanted at a concentration range of about $1 \times 10^{13}$ atoms/$cm^3$ to about $1 \times 10^{15}$ atoms/$cm^3$, at an energy range of about 3 keV-10 keV, and at an angle in the range of about 0° to about 45°, where a higher implantation angle provides better control of dislocation movement. Then, as shown in FIG. 9, a second amorphizing species implant is performed (e.g., Xe, Ge) as represented by arrows 616 so as to ensure that all of the crystalline Si under the source and drain regions is fully amorphized.

Figure 10:
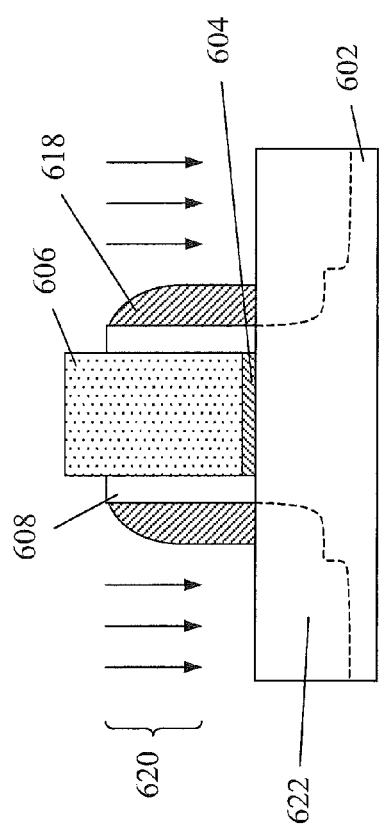

FIG. 10 illustrates the formation of a second set of sidewall spacers 618 adjacent to the first set of sidewall spacers 608. The second set of spacers 618 may be SiN, for example, formed in a conventional manner such as, for example by CVD and RIE. In any exemplary embodiment, the second set of spacers 618 may have a thickness of about 40 nm, although other thicknesses are also contemplated. The spacers 618, in addition to isolating the gate contact and source and drain contacts, also passivates the sidewalls of the gate stack. As also shown in FIG. 10, another dopant implantation (represented by arrows 620) is performed to form deep source and drain regions 622. Similar to the extension implantation, the deep source and drain regions 622 are formed by implantation of a species such as, for example, As or P, in the case of an NFET device.

Figure 11:
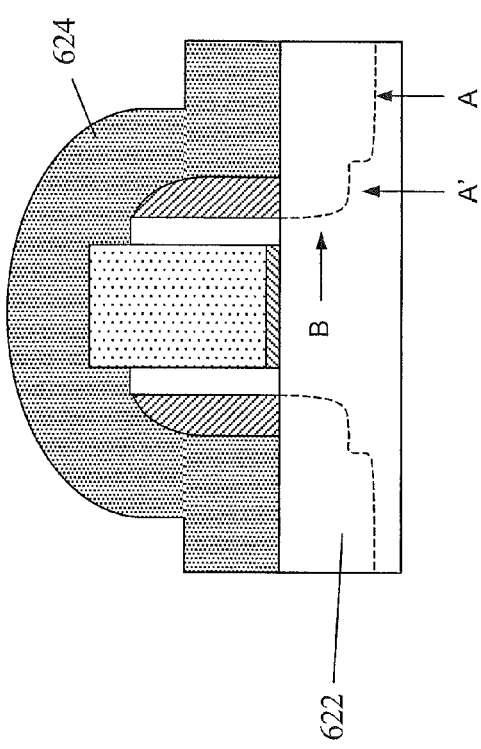

Then, as shown in FIG. 11, a stress material (liner) 624, such as SiN for example, is formed over the structure, using a deposition process in accordance with SMT. The stress liner 624 may have a thickness of about 5 nm to about 15 nm, but can be upwards of about 50 nm. After the deposition of the stress material 20, the structure undergoes an anneal process in order to create a stacking force under the structure (e.g., near the gate). In the first process flow embodiment of FIG. 3, the anneal is a high temperature anneal as discussed above (e.g., about 900° C. to about 1080° C.), which serves as both the recrystallization anneal and the dopant activation anneal. In contrast, for the second process flow embodiment of FIG. 4, the anneal is a low temperature anneal as discussed above (e.g., about 600° C. to about 650° C.), which serves only as the recrystallization anneal, where a high-temperature dopant activation anneal is performed subsequently, after the stress film is removed from the device.

In either instance, the recrystallization anneal process recrystallizes the amorphized region to create the stacking force, i.e., a stress component in the substrate. The recrystallization of the amorphized region is represented by a combination of recrystallization surfaces from a vertical surface and a horizontal surface shown schematically by arrows "A'" or "A" and "B", respectively, which meet to form the stacking force. In an exemplary embodiment, the stacking force is parallel to the gate structure. Due to the superior control of the stacking force using the carbon implant or the combination of the carbon implant and the low temperature recrystallization anneal, dislocation defects will not form under the gate structure, thus ensuring a dislocation free device with enhanced performance.

Figure 12:
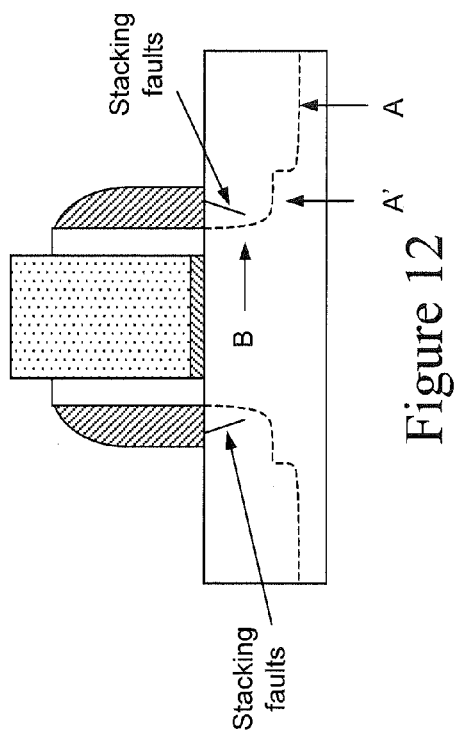

As shown in FIG. 12, the stress liner material is stripped from the structure of FIG. 10, such as by RIE, for example. After the stress material is stripped, an activation anneal at a high temperature is performed to activate the dopants, in the case of the second process flow embodiment of FIG. 4. In the case of the first process flow embodiment of FIG. 3, the dopants are already activated by the higher temperature recrystallization anneal, and thus further processing in accordance with known techniques may proceed. FIG. 12 additionally illustrates the location of the stacking faults generated by the recrystallization anneal, which faults do not extend underneath the gate.

Figure 13:
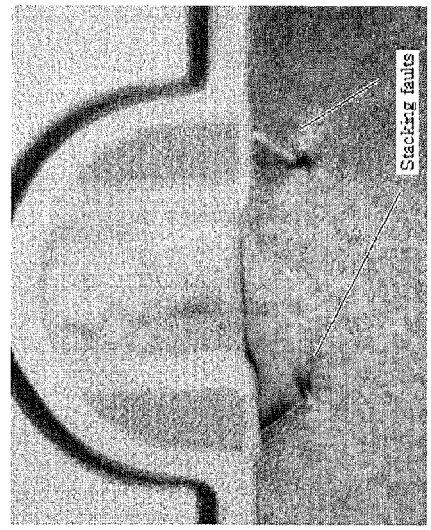
FIG. 13 is a TEM photograph illustrating stacking faults beneath the second spacers but without the formation of dislocations beneath the gate.

Finally, FIG. 13 is a TEM image of a structure similar to that depicted in FIG. 13, illustrating stacking faults beneath the second spacers but without the formation of dislocations beneath the gate.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a semiconductor device, the method comprising:
  implanting a first amorphizing species into a crystalline semiconductor substrate, the substrate having a transistor gate structure formed thereupon;
  implanting carbon into amorphized regions of the substrate by the first amorphizing species;
  following the implanting carbon, performing a second amorphizing species implant and
  performing a recrystallization anneal so as to generate stacking faults within the substrate, wherein the implanted carbon pins partial dislocations so as to prevent the dislocations from disassociating from the stacking faults and moving to a region in the substrate directly below the transistor gate structure.

2. The method of claim 1, wherein the carbon is implanted at a concentration range of about $1\times10^{13}$ atoms/cm$^3$ to about $1\times10^{15}$ atoms/cm$^3$.

3. The method of claim 1, wherein the carbon is implanted at an energy range of about 3 keV-10 keV.

4. The method of claim 1, wherein the carbon is implanted at an angle of about 0° to about 45°.

5. The method of claim 1, wherein the amorphizing species comprises one or more of germanium (Ge) and xenon (Xe).

6. The method of claim 1, wherein the recrystallization anneal is performed at a temperature of about 900° C. to about 1080° C., such that the recrystallization anneal also serves as a dopant activation anneal for source and drain regions.

7. The method of claim 1, wherein the recrystallization anneal is performed at a temperature of about 600° C. to about 650° C.

8. The method of claim 7, further comprising performing a dopant activation anneal at a temperature of about 900° C. to about 1080° C.

9. The method of claim 1, further comprising performing a source and drain extension implant simultaneously with the amorphizing species of the first amorphizing species implant.

10. A method of forming a transistor device, the method comprising:
  forming a gate structure over a crystalline semiconductor substrate;
  forming a first set of sidewall spacers adjacent the gate structure;
  implanting a first amorphizing species into the crystalline semiconductor substrate;
  implanting carbon into amorphized regions of the substrate by the first amorphizing species;
  following the implanting carbon, performing a second amorphizing species implant;
  forming a second set of sidewall spacers adjacent the first set of sidewall spacers and implanting source and drain regions;
  forming a stress-inducing layer over the substrate and gate structure; and
  performing a recrystallization anneal so as to generate stacking faults within the substrate, wherein the implanted carbon pins partial dislocations so as to prevent the dislocations from disassociating from the stacking faults and moving to a region in the substrate directly below the transistor gate structure, and wherein the recrystallization anneal is performed at a temperature sufficient to activate dopant material of the source and drain regions.

11. The method of claim 10, wherein the carbon is implanted at a concentration range of about $1\times10^{13}$ atoms/cm$^3$ to about $1\times10^{15}$ atoms/cm$^3$, at an energy range of about 3 keV-10 keV, and at an angle of about 0° to about 45°.

12. The method of claim 10, wherein the amorphizing species comprises one or more of germanium (Ge) and xenon (Xe).

13. The method of claim 10, wherein the recrystallization anneal is performed at a temperature of about 900° C. to about 1080° C.

14. A method of forming a transistor device, the method comprising:
  creating an initial sample by performing the following with respect to a first crystalline semiconductor substrate:

forming gate structure over the first crystalline semiconductor substrate;

forming a first set of sidewall spacers adjacent the gate structure;

implanting an amorphizing species into the first crystalline semiconductor substrate;

forming a second set of sidewall spacers adjacent the first set of sidewall spacers and implanting source and drain regions;

forming a stress-inducing layer over the first crystalline semiconductor substrate and gate structure;

performing a recrystallization anneal so as to generate stacking faults within the first crystalline semiconductor substrate;

determining a depth of the stacking faults in the initial sample;

performing a first computer simulation of a carbon implantation in accordance with the determined depth of stacking faults in the initial sample so as to match the peak carbon implant concentration to the determined depth of stacking faults in the initial sample; and performing the following with respect to a second crystalline semiconductor substrate to define the transistor device, using conditions according to the first computer simulation:

forming a gate structure over the second crystalline semiconductor substrate;

forming a first set of sidewall spacers adjacent the gate structure;

implanting an amorphizing species into the second crystalline semiconductor substrate;

implanting carbon into amorphized regions of the second crystalline semiconductor substrate;

forming a second set of sidewall spacers adjacent the first set of sidewall spacers and implanting source and drain regions;

forming a stress-inducing layer over the second crystalline semiconductor substrate and gate structure; and performing a recrystallization anneal so as to generate stacking faults within the substrate, wherein the implanted carbon pins partial dislocations so as to prevent the dislocations from disassociating from the stacking faults and moving to a region in the second crystalline semiconductor substrate directly below the transistor gate structure, and wherein the recrystallization anneal is performed at a temperature sufficient to activate dopant material of the source and drain regions;

wherein a peak carbon implant concentration is maximized at the depth of the stacking faults.

15. The method of claim 14, further comprising:

determining an actual peak carbon implantation depth of the transistor device;

determining whether the actual peak carbon implantation depth coincides with the depth of stacking faults in the transistor device; and performing one or more additional computer simulations of a carbon implantation in order to readjust actual carbon implantation conditions.

16. A method of forming a transistor device, the method comprising:

forming a gate structure over a crystalline semiconductor substrate;

forming a first set of sidewall spacers adjacent the gate structure;

implanting a first amorphizing species into the crystalline semiconductor substrate;

implanting carbon into amorphized regions of the substrate by the first amorphizing species;

following the implanting carbon, performing a second amorphizing species implant;

forming a second set of sidewall spacers adjacent the first set of sidewall spacers and implanting source and drain regions;

forming a stress-inducing layer over the substrate and gate structure;

performing a recrystallization anneal so as to generate stacking faults within the substrate, wherein the implanted carbon pins partial dislocations so as to prevent the dislocations from disassociating from the stacking faults and moving to a region in the substrate directly below the transistor gate structure, and wherein the recrystallization anneal is performed at a temperature sufficient to generate the stacking faults and without activating dopant material of the source and drain regions;

removing the stress-inducing layer; and performing an activation anneal so as to activate the dopant material of the source and drain regions.

17. The method of claim 16, wherein the carbon is implanted at a concentration range of about $1 \times 10^{13}$ atoms/cm$^3$ to about $1 \times 10^{15}$ atoms/cm$^3$, at an energy range of about 3 keV-10 keV, and at an angle of about 0° to about 45°.

18. The method of claim 16, wherein the recrystallization anneal is performed at a temperature of about 600° C. to about 650° C.

19. The method of claim 16, wherein the activation anneal is performed at a temperature of about 900° C. to about 1080° C.

20. A method of forming a transistor device, the method comprising:

creating an initial sample by performing the following with respect to a first crystalline semiconductor substrate:

forming a gate structure over the first crystalline semiconductor substrate;

forming a first set of sidewall spacers adjacent the gate structure;

implanting an amorphizing species into the first crystalline semiconductor substrate;

forming a second set of sidewall spacers adjacent the first set of sidewall spacers and implanting source and drain regions;

forming a stress-inducing layer over the first crystalline semiconductor substrate and gate structure;

performing a recrystallization anneal so as to generate stacking faults within the first crystalline semiconductor substrate;

removing the stress-inducing layer; and performing an activation anneal so as to activate the dopant material of the source and drain regions;

determining a depth of the stacking faults in the initial sample;

performing a first computer simulation of a carbon implantation in accordance with the determined depth of stacking faults in the initial sample so as to match the peak carbon implant concentration to the determined depth of stacking faults in the initial sample; and performing the following with respect to a second crystalline semiconductor substrate using conditions according to the first the computer simulation:

forming a gate structure over the second crystalline semiconductor substrate;

forming a first set of sidewall spacers adjacent the gate structure;

implanting an amorphizing species into the second crystalline semiconductor substrate;
implanting carbon into amorphized regions of the second crystalline semiconductor substrate;
forming a second set of sidewall spacers adjacent the first set of sidewall spacers and implanting source and drain regions;
forming a stress-inducing layer over the second crystalline semiconductor substrate and gate structure;
performing a recrystallization anneal so as to generate stacking faults within the second crystalline semiconductor substrate, wherein the implanted carbon pins partial dislocations so as to prevent the dislocations from disassociating from the stacking faults and moving to a region in the second crystalline semiconductor substrate directly below the transistor gate structure, and wherein the recrystallization anneal is performed at a temperature sufficient to generate the stacking faults and without activating dopant material of the source and drain regions;
removing the stress-inducing layer; and
performing an activation anneal so as to activate the dopant material of the source and drain regions;
wherein a peak carbon implant concentration is maximized at the depth of the stacking faults.

21. The method of claim 20, further comprising:
determining an actual peak carbon implantation depth of the transistor device;
determining whether the actual peak carbon implantation depth coincides with the depth of stacking faults in the transistor device; and
performing one or more additional computer simulations of a carbon implantation in order to readjust actual carbon implantation conditions.

* * * * *